United States Patent [19]

Shiba et al.

[11] 4,233,393
[45] Nov. 11, 1980

[54] SILVER HALIDEPHOTOSENSITIVE MATERIAL

[75] Inventors: Keisuke Shiba; Nobuyuki Kita, both of Shizuoka, Japan

[73] Assignee: Fuji Photo Film Co., Ltd., Minami-ashigara, Japan

[21] Appl. No.: 927,228

[22] Filed: Jul. 24, 1978

Related U.S. Application Data

[62] Division of Ser. No. 807,612, Jun. 17, 1977, abandoned.

[30] Foreign Application Priority Data

Jun. 18, 1976 [JP] Japan ................................. 51-71845

[51] Int. Cl.² ............................................. G03F 7/02
[52] U.S. Cl. ................................... 430/265; 430/302
[58] Field of Search ................. 96/33, 68, 60 R, 27 R, 96/94 BF, 94 R, 27 R, 35.1, 50 PL, 36.3; 430/265, 302

[56] References Cited

U.S. PATENT DOCUMENTS

| T867,012 | 10/1969 | Woodward et al. | 96/33 |
|---|---|---|---|
| T870,005 | 1/1970 | Woodward et al. | 96/33 |
| T870,022 | 1/1970 | Kenyon et al. | 96/33 |
| 3,136,637 | 6/1964 | Larson | 96/33 |
| 3,632,342 | 1/1972 | Salesin et al. | 96/68 |
| 3,642,475 | 2/1972 | Vrancken et al. | 96/60 R |
| 3,642,480 | 2/1972 | Vrancken et al. | 96/27 R |
| 3,852,066 | 12/1974 | Levy | 96/94 BF |
| 3,852,067 | 12/1974 | Levy | 96/94 R |
| 3,895,949 | 7/1975 | Akamatsu et al. | 96/68 |
| 4,021,245 | 5/1977 | Nagatomo et al. | 96/94 R |
| 4,076,531 | 2/1978 | Crowell | 96/50 R |

FOREIGN PATENT DOCUMENTS

| 681138 | 11/1966 | Belgium | 96/94 R |
|---|---|---|---|
| 52-2520 | 1/1977 | Japan | 96/94 R |
| 1139891 | 1/1969 | United Kingdom | 96/94 R |

OTHER PUBLICATIONS

The Theory of the Photographic Process, 3rd Ed. 1966 Macmillan Co., N.Y. pp. 304-311, (Mees et al.).

*Primary Examiner*—J. Travis Brown
*Attorney, Agent, or Firm*—Sughrue, Rothwell, Mion, Zinn and Macpeak

[57] ABSTRACT

A silver halide photosensitive material capable of providing a relief image after imagewise exposure, tanning development and washing off the non-exposed portions comprising a support having thereon a silver halide emulsion layer, in which the silver halide emulsion layer has thereon a synthetic resin layer which is substantially insoluble in water and permeable to water and has an oleophilic surface.

12 Claims, No Drawings

4,233,393

SILVER HALIDE PHOTOSENSITIVE MATERIAL

This is a Division of application Ser. No. 807,612, filed June 17, 1977, abandoned.

BACKGROUND OF THE INVENTION

1. Field of the Invention

This invention relates to silver halide photosensitive materials and, more particularly, to materials suitable for a printing plate through a photomechanical process.

2. Description of the Prior Art

Hitherto, PS plates in which photosensitive silver halide is used are known, but they have poor ink receptivity and have low resistance to printing and, therefore, are used only in the field of office copying. On the other hand, PS plates in which an azide compound, a diazo compound, a photo-crosslinkable polymer, a photo-polymerizable polymer, or the like is used have low sensitivity. A principal object of this invention is to overcome these defects of the prior art.

SUMMARY OF THE INVENTION

A first object of this invention to provide silver halide photosensitive materials having high physical film strength.

A second object of this invention to provide silver halide photosensitive materials which can be used to produce an image having high mechanical strength.

A third object of this invention to provide printing plates having a high resistance to printing.

A fourth object of this invention to provide PS plates having high sensitivity and which have excellent ink receptivity.

These and other objects of this invention will become apparent from the following description and examples.

As a result of much research, it has now been found that the above objects are accomplished with a silver halide photosensitive material capable of providing a relief image after imagewise exposure, tanning development and washing off the nonexposed portions comprising a support having thereon a silver halide emulsion layer on which a synthetic resin layer which is substantially insoluble in water and permeable to water and has an oleophilic surface is provided.

DETAILED DESCRIPTION OF THE INVENTION

The synthetic resin layer used in this invention has the following characteristics.

Firstly, the synthetic resin layer is not completely dissolved out and remains in the image portions on development of the silver halide emulsion layer. In particular, the solubility of the synthetic resin is about less than 10 wt % in water at 25° C.; thus, it is considered to be substantially insoluble in water.

Second, the synthetic resin layer must be sufficiently permeable to water and an alkaline solution so that development and other processings of the silver halide emulsion layer can be performed.

Thirdly, the surface of the synethtic resin layer is oleophilic. The degree of oleophilicity can be evaluated by means of the difference between the contact angle of water in kerosine $\theta$ w/o and the contact angle of kerosine in water $\theta$ o/w at ordinary temperature (about 24° C.). As for the synthetic resin layer of this invention, it is particularly preferred for the value of $-[\theta$ o/w$-\theta$ w/o] to be positive. Contact angles and their measurement is described in general in Jikken Kagaku Koza (Lecture on Experimental Chemistry) published by Maruzen Co., Vol. 7 pp 74-85 (1971) and the contact angles $\theta$ o/w and $\theta$ w/o in particular can be measured using the "Captive Bubble Method" described in Mitsuo Obana, "Wetting Phenomenon of Lithographic Plates," Japan Printer, 25 (Oct. 1968). A $\theta$ o/w of 0° to less than 90° is considered to be oleophilic and a $\theta$ w/o of 90° or higher is considered to be hydrophilic and thus the expression $\theta = -[\theta$ w/o$-\theta$ w/o] is a measure of the ink receptivity and such is preferably greater than about 30°.

The permeability to water of the synthetic resin layer can be evaluated by means of the rate of increase in film thickness due to swelling by water which is measured using samples comprising a support having thereon a gelatin layer of a dry thickness of about 4 $\mu$ having thereon a resin layer of a dry thickness of about 1 $\mu$. With a permeability of 1, no permeation of water into the synthetic resin layer occurs and with this as a basis, a preferred permeability of water into the synthetic resin layer is about 1.3 or higher.

Examples of supports used in this invention include synthetic resin films such as cellulose acetate, polyethylene terephthalate or polystyrene, and laminated films of these resins, synthetic papers, base papers, synthetic resin films such as polyolefin films, papers laminated with a metal foil such as aluminum or zinc, and metal sheets such as aluminum or zinc sheet. Of these, aluminum sheets are preferred for printing plates, and the surface thereof may be a smooth surface, a grained surface or an anodized surface. A support having a hydrophilic surface is preferred.

The silver halide emulsion layer used in this invention comprises finely divided grains of silver halide dispersed in a binder and can form images, after imagewise exposure, in the presence of a developing agent such as hydroquinone or derivatives thereof, catechol or derivatives thereof, pyrogallol or derivatives thereof, metol, phenidone, or the like. The developing agent can be incorporated in the photosensitive material, if desired.

Suitable silver halides which can be used in the silver halide emulsion layer include, e.g., silver chloride, silver bromide, silver iodide or mixed silver halides. A suitable average grain size for the silver halide can range from about 0.03 to about 2 $\mu$, preferably 0.03 to 0.5 $\mu$. The silver halide emulsion can be unsensitized (e.g., a so-called primitive emulsion) a chemically sensitized emulsion or a spectrally sensitized emulsion. Examples of suitable binders for the silver halide emulsion include hydrophilic colloids generally used in conventional silver halide emulsions e.g., gelatin, gelatin derivatives, polymethacrylamide, polyvinyl alcohol, polyacrylic acid. Of these, a hydrophilic colloid capable of being tanned in development in preferred, and a hydrophilic colloid containing a primary amino group is particularly preferred. A suitable coating thickness for the silver halide emulsion can range from about 0.01 to about 20 $\mu$m, preferably 0.2 to 10 $\mu$m.

The synthetic resin layer used in the silver halide photosensitive element of the present invention is characterized as providing a high oleophilicity while being permeable to water and as not hardening the silver halide emulsion layer thereunder, U.S. Pat. No. 3,561,961 discloses a photographic element comprising a support coated with a hydrophilic photosensitive silver halide emulsion with an outer surface thereon which is oleophilic and water-permeable being provided by a coating of an oleophilic Werner-type chromium complex, a polymeric aldehyde and so on. These coating materials, however, harden the silver halide emulsion, that is, the silver halide emulsion layer at the unexposed areas is also hardened so that a relief image can not be obtained by subjecting the element to a tanning development and a wash-off with water. As can be accomplished with the photosensitive silver halide element of the present invention.

Examples of compounds which can be used for the synthetic resin layer of this inventioin can be selected from polymers and oligomers such as polyesters, polyamides, phenol-aldehyde resins, polyurethanes, epoxy resins, silicone resins, polyamines, polystyrenes, polyacrylates, polyvinyl acetate, hydroxypropyl methyl cellulose or hexahydrophthalate. A suitable molecular weight for the above-described polymers can range from about 5,000 to about 100,000 and a suitable molecular weight for the above-described oligomers is about 500 to about 5,000. Polymers and oligomers such as polystyrenes, polyacrylates, polyvinyl acetate, polyurethanes or hydroxypropyl methyl cellulose or hexahydrophthalate are particularly preferred. These synthetic resin can be used individually or as a combination of two or more thereof.

Suitable solvents which can be used for the synthetic resin layer coating composition include benzene, toluene, xylene, methylene chloride, trichloroethylene, n-hexane, acetone, methyl ethyl ketone, cyclohexanone, ethyl acetate, butyl acetate, tetrahydrofuran, ethanol, etc. The synthetic resin layer generally has a thickness of about 0.01 to about 20 μm, preferably 0.2 to 10 μm, on a dry basis.

Suitable coating techniques which can be employed to coat the silver halide emulsion layer on the support and to coat the synthetic resin layer on the silver halide emulsion layer include dip coating, extrusion coating, rod coating, curtain coating, gravure coating, spinner coating, etc. Two or more layers can be coated at the same time if desired.

If desired, a subbing layer may be employed between the support and the silver halide emulsion layer. Suitable examples of subbing layers are those of hydrophilic polymers such as gelatin, gelatin derivatives, polyvinyl alcohol, polyvinyl pyrrolidone, polyvinyl imidazole, preferably those of tanning-developable hydrophilic polymers having primary amino groups.

The silver halide photosensitive material of this invention can be appropriately exposed using various techniques, e.g., contact exposure, enlarging exposure, etc. using light from light sources such as a tungsten lamp, a xenon lamp, using electron beam irradiation, etc. A suitable exposure time can range from about $10^{-5}$ seconds (flash exposure) to about 100 seconds. A preferred exposure is an enlarging exposure using light from a tungsten lamp or a xenon lamp. A particularly preferred exposure time is 1 to 10 seconds or $10^{-5}$ seconds of flash exposure to light from a xenon lamp.

After imagewise exposure the silver halide photosensitive material of this invention is preferably subjected to tanning development. Tanning development is described in detail in C. E. K. Mees, *The Theory of the Photographic Process*, Revised Ed. page 580–584, Macmillan New York (1957). A chemical structural feature of the developing agents is that they are benzenes or derivatives thereof in which each contains at least one hydroxy group and preferably, polyhydroxybenzenes substituted with halogen atoms such as chlorine, bromine, iodine or fluorine; aryl groups; amino groups; alkyl groups having 1 to 6 carbon atoms or substituted alkyl groups; or/and alkoxy groups.

Specific examples of suitable tanning developing agents include hydroquinone, toluhydroquinone, chlorohydroquinone, pyrogallol, resorcinol, hexylresorcinol, phloroglucinol, 4-benzylcatechol, 4-phenylcatechol and the like. Subsequent to the tanning development the unexposed areas are simply washed out with warm water at a temperature of higher than about 35° C. to produce relief images.

The following examples are given to further illustrate this invention in greater detail without limiting the same. Unless otherwise indicated, all parts, percentages, ratios and the like are by weight.

EXAMPLE 1

A 2S aluminum sheet of a thickness of 0.24 mm was degreased and grained in a hydrochloric acid aqueous solution of a concentration of about 1% by passing therethrough an alternating current of about 10 volts for about 20 minutes at about 30 to about 36° C. Then, the sheet was washed with water and dried. Next, on the sheet, a gelatin layer of a dry thickness of about 0.2 μ was provided and, further, a gelatin-silver bromoiodide emulsion layer of a dry thickness of about 4.0 μ was provided. The emulsion used contained 57 g of gelatin and 0.32 g equivalent of silver bromoiodide (1 mol % of iodide ion per kg of emulsion). On this emulsion layer, a synthetic resin layer of a dry thickness of 1 μ shown in Table 1 below was provided.

TABLE 1

| Sample No. | Resin Used for Resin Layer |
|---|---|
| A | Cresol-formaldehyde resin (mol. wt.; about 3000) |
| B | Reaction product obtained from 2 mols of hydroxyethyl acrylate and 1 mol of 4,4'-methylenephenyl diisocyanate |
| C | Mixture of 20 parts of the above Reaction Product B and 1 part of a reaction product obtained from 86% by weight of vinyl chloride, 13% by weight of vinyl acetate and 1% by weight of maleic anhydride. |
| D | Reaction product obtained from 1 mol of trimethylolpropane, 3 mols of 4,4'-methylenephenyl diisocyanate and 3 mols of hydroxyethyl methacrylate |
| E (for comparison) | Gelatin |

After imagewise exposure to light from a xenon lamp using a camera for producing a, printing plate with an image enlargement of 4 times, the thus obtained photosensitive material was developed at 20° C. for 90 seconds using the following developer, washed with warm water at 45° C. and then dried.

| Composition of Developer | |
|---|---|
| Pyrogallol | 3 g |
| Metol | 1 g |
| Sodium Carbonate (anhydrous) | 112.5 g |
| Potassium Bromide | 1.5 g |
| Citric Acid | 1 g |
| Sodium Polymetaphosphate | 1 g |
| Water | to 1 liter |
| | pH = 10.8 |

Printing was done using the thus obtained printing plates by means of a printer (ROTA PRINT R 40/K-30) using an ink (F-gloss type, produced by Toyo Ink Co., Ltd.) followed by application thereof a gum solution (GP produced by Fuji Photo Film Co., Ltd.) and using water as a fountain solution. The results obtained are shown in Table 2 below.

TABLE 2

| Sample No. | Ink Receptivity* | Water Permeability** | Spoilage*** | Length of Press Run |
|---|---|---|---|---|
| A | +51 | 1.5 | 12 | More than 12,000 |
| B | +56 | 2.0 | 17 | " |
| C | +80 | 1.7 | 8 | More than 15,000 |
| D | +32 | 1.8 | 27 | More than 12,000 |
| E (for comparison) | −56 | More than 2.0 times | More than 200 | 2,000 |

*Ink Receptivity = the degree of oleophilicity or the values of $\theta = -[\theta\ o/w - \theta\ w/o]$
**Rate of increase in film thickness due to swelling by water.
***Number of papers wasted before sufficient quality prints could be obtained.

From the above results, it is clear that the samples of this invention exhibit improved ink receptivity and improved resistance to printing as compared with Sample E for comparison.

While the invention has been described in detail and with reference to specific embodiments thereof, it will be apparent to one skilled in the art that various changes and modifications can be made therein without departing from the spirit and scope thereof.

What is claimed is:

1. A process of preparing a printing plate which comprises the steps of
   (1) imagewise exposing a silver halide photosensitive material comprising a support having a hydrophilic surface, a silver halide photosensitive emulsion layer on said surface and synthetic resin layer on said emulsion layer, with the synthetic resin being substantially insoluble in water, with the synthetic resin layer being permeable to water and an alkaline solution and with the synthetic resin being at least one of a polymer and oligomer, and being selected from the group consisting of polyesters, polyamides, phenolaldehyde resins, polyurethanes, epoxy resins, silicone resins, polyamines, polystyrenes, polyacrylates, polyvinyl acetate, hydroxypropyl methyl cellulose and hexahydrophthalate.
   (2) tanning developing said exposed photosensitive material, and then
   (3) washing-off said tanning developed photosensitive material with water to remove non-tanned area of said emulsion layer and synthetic resin layer on said area to reveal the hydrophilic surface of the support, thereby to form a printing plate.

2. The process of claim 1 wherein said synthetic resin is at least one selected from the group consisting of polystyrenes, polyacrylates, polyvinyl acetate, polyurethanes, hydroxypropyl methyl cellulose and hexahydrophthalate.

3. The process of claim 1, wherein said synthetic resin layer has a thickness of about 0.01 to about 20 μm.

4. The process of claim 3, wherein said synthetic resin layer has a thickness of 0.2 to 10 μm.

5. The process of claim 3, wherein said emulsion layer has a thickness of about 0.01 to about 20 μm.

6. The process of claim 4, wherein said emulsion layer has a thickness of 0.2 to 10 μm.

7. The process of claim 1, wherein said support is an aluminum sheet.

8. The process of claim 7, wherein the surface of said aluminum sheet is grained.

9. The process of claim 7, wherein the surface of said aluminum sheet is anodized.

10. The process of claim 7, wherein said photosensitive material has a subbing layer between the hydrophilic surface of said support and said emulsion layer.

11. The process of claim 10, wherein said subbing layer is a layer of a hydrophilic polymer selected from the group consisting of gelatin, gelatin derivatives polyvinyl alcohol, polyvinyl pyrrolidone and polyvinyl imidazole.

12. The process of claim 1, wherein said polymer has a molecular weight ranging from about 5,000 to about 100,000 and said oligomer has a molecular weight ranging from about 500 to about 5,000.

* * * * *